United States Patent
Schick et al.

(10) Patent No.: US 7,171,181 B2
(45) Date of Patent: Jan. 30, 2007

(54) METHOD FOR ACHIEVING IMMEDIATE AND ACCURATE AUTOMATIC FREQUENCY TUNING

(75) Inventors: David B. Schick, Flushing, NY (US); Stan Mandelkern, Teaneck, NJ (US); Iouri Kazarov, Wayne, NJ (US); Leonid Khatutskiy, Philadelphia, PA (US); Valeriy Armencha, Brewster, NY (US)

(73) Assignee: Schick Technologies, Inc., Long Island City, NY (US)

( * ) Notice: Subject to any disclaimer, the term of this patent is extended or adjusted under 35 U.S.C. 154(b) by 161 days.

(21) Appl. No.: 10/637,671

(22) Filed: Aug. 11, 2003

(65) Prior Publication Data

US 2005/0037720 A1    Feb. 17, 2005

(51) Int. Cl.
*H04B 7/00* (2006.01)
*H04B 1/18* (2006.01)

(52) U.S. Cl. ............ 455/255; 455/164.2; 455/182.1; 455/192.2; 455/277.1

(58) Field of Classification Search ........ 455/255–259, 455/266, 277.1, 277.2, 293, 334, 340, 67.11, 455/67.13, 115.1–115.4, 130, 133–135, 137–140, 455/141, 150.1, 154.1

See application file for complete search history.

(56) References Cited

U.S. PATENT DOCUMENTS

| | | | | |
|---|---|---|---|---|
| 3,946,329 A | | 3/1976 | Caspari | 331/4 |
| 4,280,140 A | * | 7/1981 | Skerlos | 348/735 |
| 4,408,349 A | * | 10/1983 | Yukawa | 455/182.3 |
| 5,280,636 A | * | 1/1994 | Kelley et al. | 455/131 |
| 5,450,442 A | * | 9/1995 | Umemoto et al. | 375/230 |
| 5,548,619 A | * | 8/1996 | Horiike et al. | 375/344 |
| 5,737,694 A | * | 4/1998 | McMahill et al. | 455/76 |
| 5,796,777 A | | 8/1998 | Terlep et al. | 375/227 |
| 6,298,227 B1 | | 10/2001 | Molnar | 455/323 |
| 6,463,266 B1 | | 10/2002 | Shohara | 455/196.1 |
| 6,654,595 B1 | * | 11/2003 | Dexter | 455/323 |

* cited by examiner

*Primary Examiner*—Tony T. Nguyen
(74) *Attorney, Agent, or Firm*—Fitzpatrick, Cella, Harper & Scinto

(57) ABSTRACT

An automatic frequency tuning (AFT) system which can effect immediate and accurate automatic frequency tuning of the local oscillator (LO) of a receiver, in order to achieve a stable intermediate frequency (IF) signal while reducing the power consumption and the cost of the system. In the automatic frequency tuning (AFT) system, an analog-to-digital converter (ADC) converts the intermediate frequency (IF) to a digital value which is sent to a microcontroller. A signal sent from the microcontroller accurately and automatically tunes the local oscillator (LO).

24 Claims, 2 Drawing Sheets

METHOD FOR ACHIEVING IMMEDIATE AND ACCURATE AUTOMATIC FREQUENCY TUNING

BACKGROUND OF THE INVENTION

1. Field of the Invention

This invention relates generally to the field of automatic frequency tuning in wireless applications, and more particularly to a technique for immediately and accurately tuning the local oscillator of a receiver.

2. Description of the Related Art

Wireless communications systems have become commonplace in today's society, and are used in a wide variety of applications. Such communications systems consist of several basic subassemblies, for example, a transmitter with an antenna separated by some distance from a receiver with an antenna.

A transmitter performs two basic functions. First, it generates, on the correct frequency, a signal of sufficient power to reach the area of interest. Second, it changes the "intelligence" frequency to one suitable for transmission, where intelligence may include speech, code, music, or video. To perform these functions, a transmitter must have a frequency determining circuit, or an oscillator, a modulator, and RF amplifiers.

In order to transmit intelligence, or information, the information must be raised in frequency so that it is suitable to be transmitted through free space as electromagnetic radiation. To convert information to a form suitable for transmission through free space, an electronic technique known as modulation is used. Modulation is the act of varying a characteristic associated with one wave in accordance with a characteristic associated with another wave. The base, or carrier wave, can be varied, for example, in frequency, amplitude, bandwidth, or duration of transmitter "ON" time.

Whatever type of modulation is used, the receiver in the communications system must be able to demodulate the transmitted information to extract the intelligence component. A receiver essentially takes an input consisting of modulated electromagnetic radio waves and converts these waves into a format usable by an operator. Circuitry within the receiver removes the intelligence from the RF carrier and restores it to its original frequency and format. In effect, a receiver reverses the process performed by the transmitter, through functions including, for example, reception, selection, detection, and reproduction.

Typical receivers operate by reducing the input frequency to a lower frequency for amplification, detection, and processing. The very high input signal frequency intercepted by the receiver antenna is mixed with a lower, internally generated variable frequency to produce a fixed frequency known as the intermediate frequency (IF). The intermediate frequency (IF) is detected, processed, and amplified for conversion back into the same format as the original modulating signal in the transmitter.

Typically, the input RF is mixed with a local oscillator (LO) frequency. The local oscillator (LO) attempts to control any tuning or frequency adjustments required to lock the receiver to the transmitter frequency. Automatic frequency control (AFC) circuits are used in an effort to keep the frequency stable within system parameters, because necessary adjustments often occur too rapidly for a human operator to perform. The goal of automatic frequency control (AFC) circuits is to achieve a stable intermediate frequency (IF) signal.

In other words, although receiver amplifiers typically require a predetermined frequency, wireless carrier signals tend to exhibit frequency drift. Therefore, a challenge in the field has been to convert an unstable signal to one that can be utilized by the receiver. Automatic frequency converters have traditionally provided a mechanism for tuning carrier signals so that they may be amplified by the receiver system. Typically, the local oscillator (LO) frequency is mixed with the carrier frequency in an attempt to ensure a stable intermediate signal. Often, coarse adjustments are made with a dial or channel selector. With automatic frequency tuning, directional fine adjustments may also be made iteratively using binary circuitry depending on the value of the incoming signal.

Although prior art techniques are generally good for their intended purposes, further improvements are necessary. For example, one challenge results from the common use in wireless applications of voltage-controlled oscillators (VCOs) to transmit the carrier signal. Voltage-controlled oscillators (VCOs) utilize passive components to convey the pulse, which is one reason the resulting frequency may drift about the chosen bandwidth. Often, the volume of data may be large, requiring a broader bandwidth such that even minimal drift can prevent successful transmission. As explained above, receivers often compensate for this variability by utilizing automatic frequency control (AFC) techniques. Commonly, in such techniques, the frequency is adjusted by a set of comparators that relate the analog signal to the set point of the receiver. Many algorithms make use of binary circuitry to determine whether an adjustment should be made in the positive or negative direction. The adjustment is then made iteratively until the set point is equivalent to the frequency of the incoming carrier signal. In other words, in such prior art techniques, typically the frequency is iteratively tuned according to a series of directional adjustments. There exists a great need for the frequency to be immediately tuned to the exact frequency required. The technique should ideally do so both immediately and accurately.

An example of a commonly used scheme is discussed in U.S. Pat. No. 3,946,329 to Caspari, which relates to an electronic automatic frequency tuning system. In Caspari, the frequency of the local oscillator is varied until a predetermined relationship between the local oscillator signal and a reference generator signal is identified. Then, upon identification of the predetermined relationship, the frequency of the oscillator output signal is stabilized at a substantially constant value. To stabilize the frequency of the oscillator signal, the reference generator signal and the local oscillator signal are combined and a resulting difference frequency signal is applied to a discriminator. The discriminator provides an output signal which applies a control signal to the oscillator resulting in oscillator signal frequency corrections compensating for changes in the oscillator signal frequency. The local oscillator frequency is increased or decreased accordingly. The automatic frequency tuning circuit is not dependent on the received signal, i.e., the signal for which demodulation is typically desired, and therefore a loss of the received signal does not affect the frequency of the oscillator signal. However, in the presence of the received signal, an automatic frequency control (AFC) circuit utilizing the received signal controls the frequency of the local oscillator output signal.

Prior art techniques such as those discussed in Caspari which rely for example on iterative adjustments in the positive or negative direction suffer from certain drawbacks. First, while such iterative processes may attempt to adjust the local oscillator appropriately, the exact intermediate frequency may never be achieved. In addition, as explained above, the volume of data is often large, which requires a broader bandwidth such that even minimal drift can prevent successful transmission.

Furthermore, transmitters typically have an intermediate period during which no data is sent, such as the period immediately following power-up. Therefore, a so-called dummy waveform or preamble component is typically sent by the transmitter to allow the receiver to adjust properly. In prior art systems using automatic frequency control (AFC) techniques such as those explained above, a prolonged preamble component is often needed for the system to adjust. This may be both time consuming and power consuming. In wireless applications, conserving power is a paramount concern, as a temporary power source such as a battery is often used. There is therefore a great need to provide an automatic frequency tuning (AFT) technique which can enable a shorter preamble component, thereby conserving power.

In the past, some efforts have concentrated on improving the stability of the voltage-controlled oscillator (VCO), on the theory that the more stable the source, the less time it may take to tune the local oscillator (LO). Unfortunately, such more stable components are often more costly as well, and may take up more occupied space. Since there are numerous cost-sensitive and miniaturized applications, such a design may not be appropriate.

There exists, therefore, a great need for an automatic frequency tuning system which takes an entirely fresh approach, and overcomes the above-mentioned obstacles which have heretofore plagued the prior art.

SUMMARY OF THE INVENTION

Accordingly, it is an object of this invention to provide an automatic frequency tuning (AFT) system which can effect immediate and accurate automatic frequency tuning of the local oscillator (LO) of a receiver, in order to achieve a stable intermediate frequency (IF) signal.

It is another object of this invention to provide an automatic frequency tuning (AFT) technique which can enable a shorter preamble component, and which reduces the power consumption and cost of the system.

It is another object of this invention to provide an automatic frequency tuning (AFT) technique which in effect instantaneously compensates for drift in a carrier signal. The scheme taught by the present invention works with a typically unstable carrier source, such as a voltage-controlled oscillator (VCO).

In accordance with the teachings of the present invention, these and other objects may be accomplished by the present invention, which makes use of an analog-to-digital converter (ADC) to convert the intermediate frequency (IF) to a known value so that the local oscillator (LO) may be exactly and automatically tuned by a microcontroller using an algorithm. The incoming signal strength is measured in an effort to ensure that extraneous noise does not influence the automatic frequency tuning (AFT) method.

The invention teaches an automatic frequency tuning (AFT) system that can instantaneously and accurately reach the carrier frequency. An important aspect of this invention is that it can determine the exact tuning frequency within approximately 5 microseconds. A second important aspect of this invention is that it can be utilized with an unstable and simple VCO. This may reduce consumed power and space, as well as overall cost.

The invention in one embodiment provides a receiver, comprising a mixing circuit, a local oscillator, an analog-to-digital converter, and a microcontroller. The mixing circuit is adapted to mix an input signal with an internal signal in order to produce an intermediate frequency signal which undergoes signal processing. The local oscillator is adapted to generate the internal signal. The analog-to-digital converter is adapted to convert the intermediate frequency signal to a digital signal. The microcontroller is adapted to determine the internal signal required based on the digital signal, and to send a control signal to the local oscillator which tunes the local oscillator to the internal signal in order to obtain the intermediate frequency signal required.

The receiver may comprise a signal strength indicator adapted to measure the signal strength of the intermediate frequency signal, wherein the intermediate frequency signal strength indicator prevents the passing of the intermediate frequency signal to the analog-to-digital converter if the measured signal strength is below a predetermined level. The local oscillator may be tuned to the internal signal within 5 microseconds. The input signal may be sent from a wireless intra-oral sensor.

The invention in another embodiment provides a method of tuning a local oscillator of a receiver. The method comprises the steps of receiving and amplifying an input signal, and mixing the input signal with an internal signal generated by a local oscillator in order to produce an intermediate frequency signal. The method further comprises the steps of processing the intermediate frequency signal to produce a baseband signal, converting the intermediate frequency signal to a digital signal, determining the internal signal required based on the digital signal, and sending a control signal to the local oscillator which tunes the local oscillator to the internal signal in order to obtain the intermediate frequency signal required.

The invention in another embodiment provides a receiver, comprising a radio frequency amplifier adapted to amplify an input signal, and a local oscillator adapted to generate an internal signal. A mixing circuit is adapted to mix the input signal with the internal signal to generate an intermediate frequency signal. An intermediate frequency filter is adapted to filter the intermediate frequency signal. An intermediate frequency amplifier is adapted to amplify the filtered intermediate frequency signal. A detector is adapted to produce a baseband signal from the amplified intermediate frequency signal. An integration circuit is adapted to process the intermediate frequency signal output by the detector. An analog-to-digital converter is adapted to convert the intermediate frequency signal output by the integration circuit to a digital signal. A microcontroller is adapted to determine the internal signal required based on the digital signal, and to send a control signal to the local oscillator to tune the local oscillator to the internal signal in order to obtain the intermediate frequency signal required.

The invention in another embodiment provides a receiver, comprising means for mixing an input signal with an internal signal in order to produce an intermediate frequency signal, means for generating the internal signal, and means for converting the intermediate frequency signal to a digital signal. The receiver further comprises means for determining the internal signal required based on the digital signal and sending a control signal to the means for generating the internal signal for tuning to the internal signal in order to obtain the intermediate frequency signal required.

The invention in another embodiment provides a receiver, comprising a local oscillator adapted to generate an internal signal, and a mixing circuit adapted to mix an input signal with the internal signal in order to produce an intermediate frequency signal. An analog-to-digital converter is adapted to convert the intermediate frequency signal to a digital signal. A microcontroller is adapted to determine the internal signal required based on a comparison of the digital signal with a required intermediate frequency signal, and to send a control signal to the local oscillator which tunes the local oscillator to the internal signal in order to obtain the required intermediate frequency signal.

The invention will next be described in connection with certain exemplary embodiments; however, it should be clear to those skilled in the art that various modifications, additions, and subtractions can be made without departing from the spirit or scope of the claims.

BRIEF DESCRIPTION OF THE DRAWINGS

The invention will be more clearly understood by reference to the following detailed description of exemplary embodiments in conjunction with the accompanying drawings, in which.

DETAILED DESCRIPTION OF THE PREFERRED EMBODIMENTS

As mentioned above, the invention utilizes an analog-to-digital converter (ADC) to convert the intermediate frequency (IF) to a known digital value so that the local oscillator (LO) may be accurately and automatically tuned by a microcontroller. In one embodiment, the microcontroller determines the local oscillator (LO) frequency needed based on a comparison between the digital signal output from the analog-to-digital converter (ADC) and the required intermediate frequency (IF).

Figure 1:
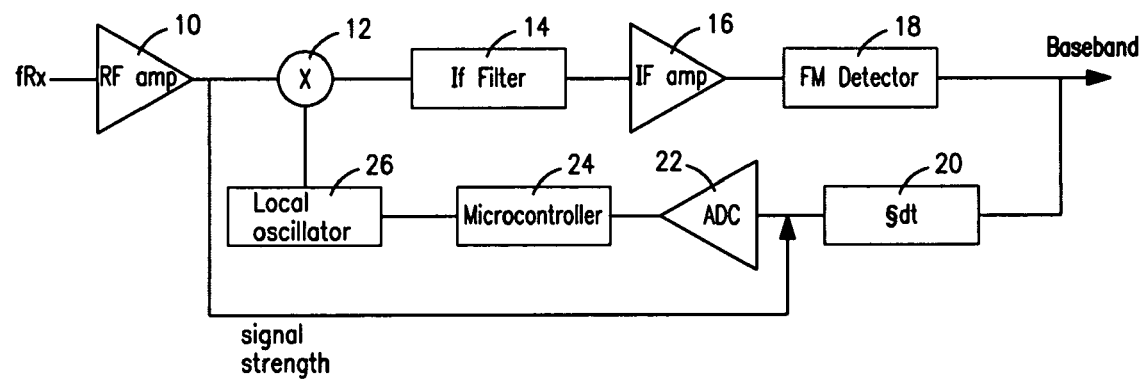
FIG. 1 is a block diagram of an embodiment of the present invention.

By way of example, the embodiment of the present invention as shown in FIG. 1 is directed to an application used in the field of dentistry, namely, a wireless intra-oral sensor used to take images of the inside of a patient's mouth. Wireless image sensors (such as those used in, for example, digital radiology) may comprise a charge-coupled device (CCD) or a CMOS active pixel sensor array (APS). Wireless intra-oral sensors may particularly benefit from this invention, since power and space are at a premium in such devices.

In the embodiment described herein, a signal is sent from a wireless intraoral sensor using a simple, low cost, and miniature voltage-controlled oscillator (VCO). The signal is received by a remote receiver which implements the automatic frequency tuning (AFT) method taught by the present invention. One advantage of the embodiment of this invention as described herein is that the period during which the voltage-controlled oscillator (VCO) must be powered may be minimized, as only a limited preamble component is necessary. While this embodiment of the invention is described in connection with a wireless intraoral sensor and associated receiver in particular, numerous other applications would be readily apparent to those skilled in the art, and the invention is of course not limited in scope to this particular example.

FIG. 1 shows an embodiment according to the present invention. The system comprises a radio frequency (RF) amplifier 10, a mixing circuit 12, an intermediate frequency (IF) filter 14, an intermediate frequency (IF) amplifier 16, an FM detector 18, an integration circuit 20, an analog-to-digital converter (ADC) 22, a microcontroller 24, and a local oscillator (LO) 26.

The RF amplifier 10 receives digital carrier signals from an antenna. The digital carrier signals are transmitted in this example at a nominal frequency of 2.4 GHz, and are channel selectable within an 83.5 MHz band. The digital data is represented within the carrier by a deviation of ±2.2 MHz. Also in this example, the volume of data is large, and therefore the data rate must be set at 5 MHz. Again, it is of course to be understood that the examples described herein are by way of illustration only, and the present invention is not limited by the details shown in the examples.

The incoming signal is combined with a waveform from the local oscillator (LO) 26 in the mixing circuit 12. The resulting intermediate frequency (IF) is fed into the intermediate frequency (IF) filter 14 to improve the waveform quality. This signal is then amplified in the intermediate frequency (IF) amplifier 16 and fed into the FM detector 18. The FM detector 18 translates the intermediate frequency (IF) to a corresponding voltage. This voltage is considered to be the baseband signal.

Many conventional AFT circuits would at this point utilize binary circuitry as described above to iteratively approach an improved signal using a series of directional adjustments. Instead, the present invention teaches to utilize an analog-to-digital converter (ADC) to convert the intermediate frequency (IF) to a known digital value so that the local oscillator (LO) may be immediately and accurately tuned by a signal sent from the microcontroller 24. Thus, the exact carrier frequency value may be ascertained and the tuning frequency may be instantaneously adjusted. In this way, the microcontroller 24 can determine the exact frequency the local oscillator (LO) needs to be tuned to. One advantage to this method is that the carrier requires only a minimal preamble component for the receiver to adjust accordingly; another is that minimal power is utilized. Moreover, a receiver using the method of this invention is capable of receiving signals sent from a transmitter using a simple voltage-controlled oscillator (VCO).

The utilization of the integration component 20 enables the average DC value of the signal to be resolved. The signal is then passed through the analog-to-digital converter 22 as described above. The value is digitized only when the signal strength is above a predetermined value. The purpose of this signal strength input is to prevent lower power extraneous noise from affecting the automatic frequency tuning (AFT) method; that is, if the signal is merely noise, this noise won't affect the algorithm of the microcontroller 24. The microcontroller 24 sends a serial signal to the local oscillator (LO) 26 with the tuning frequency needed so that the required intermediate frequency may be exactly obtained.

Of course, other embodiments may be readily envisioned by those skilled in the art. For example, although the RF amplifier 10 receives digital carrier signals from an antenna, the system may be reconfigured to deal with analog data and the data may be received by means other than a simple antenna.

Figure 2:
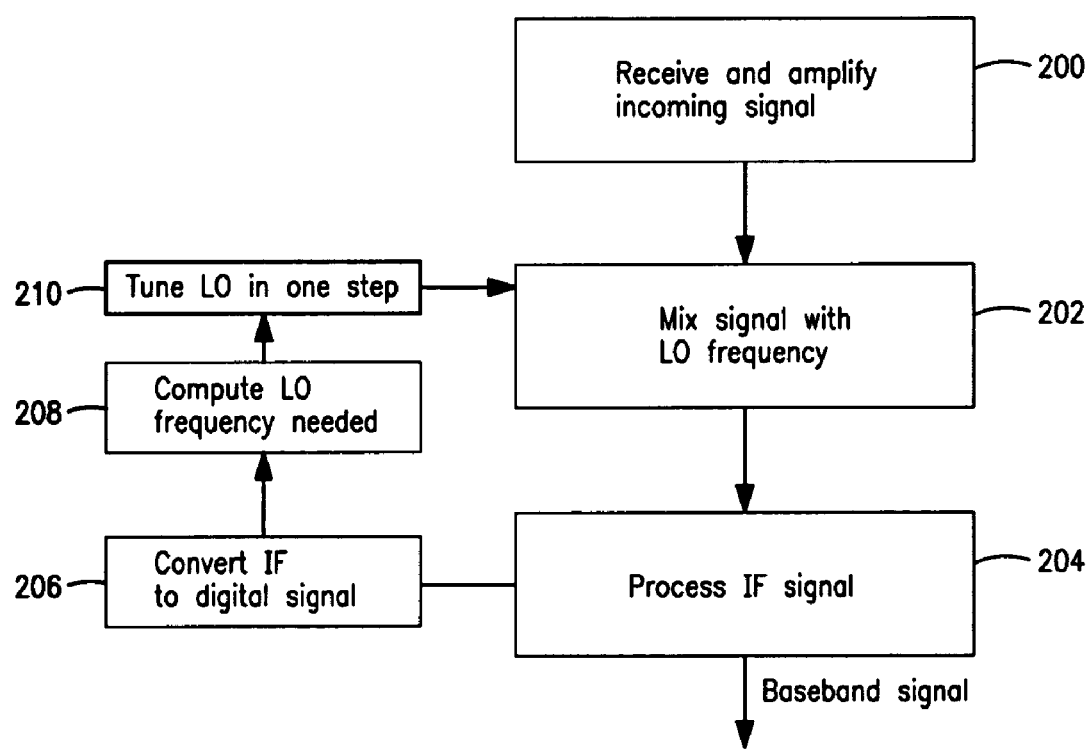
FIG. 2 is a flowchart which illustrates an embodiment of the present invention.

FIG. 2 is a flowchart which illustrates an embodiment of the present invention. In the embodiment, a signal is sent from a transmitter and is received by a remote receiver which implements the automatic frequency tuning (AFT) method taught by the present invention. In FIG. 2, an incoming signal is received and amplified in step 200. In step 202, the incoming signal is mixed with a waveform from a local oscillator (LO). The resulting intermediate frequency (IF) undergoes signal processing in step 204, which may include filtering, amplification, and detection, to produce a baseband signal. In step 206 the intermediate frequency (IF) is converted to a digital value, and then, in step 208, an algorithm computes the local oscillator frequency needed to obtain the required intermediate frequency (IF) signal. In step 210, a signal is fed to the local oscillator (LO) with the precise tuning frequency needed so that the local oscillator (LO) may be immediately and accurately tuned. In this way, the exact carrier frequency value may be ascertained and the tuning frequency may be instantaneously adjusted.

While the invention has been particularly shown and described with respect to preferred embodiments thereof, it will be understood by those skilled in the art that changes in form and details may be made therein without departing from the scope and spirit of the invention.

The invention claimed is:

1. A receiver, comprising:
a mixing circuit adapted to mix an input signal with an internal signal in order to produce an intermediate frequency signal which undergoes signal processing;
a local oscillator adapted to generate the internal signal;
a frequency detector adapted to translate the intermediate frequency signal directly to a voltage;
an analog-to-digital converter adapted to convert the voltage to a digital signal; and
a microcontroller adapted to determine the internal signal required based on the digital signal, and to send a control signal to the local oscillator which tunes the local oscillator directly to the determined internal signal in a one-step adjustment without iteration in order to obtain the intermediate frequency signal required.

2. The receiver as set forth in claim 1, further comprising a signal strength indicator adapted to measure a signal strength of the intermediate frequency signal.

3. The receiver as set forth in claim 2, wherein the intermediate frequency signal strength indicator prevents the passing of the intermediate frequency signal to the analog-to-digital converter if the measured signal strength is below a predetermined level.

4. The receiver as set forth in claim 1, wherein the local oscillator is tuned to the internal signal within 5 microseconds.

5. The receiver as set forth in claim 1, wherein the input signal is sent from a wireless intra-oral sensor.

6. A method of tuning a local oscillator of a receiver, comprising the steps of:
receiving and amplifying an input signal;
mixing the input signal with an internal signal generated by a local oscillator in order to produce an intermediate frequency signal;
translating the intermediate frequency signal directly to a voltage;
converting the voltage to a digital signal;
determining the internal signal required based on the digital signal; and
sending a control signal to the local oscillator which tunes the local oscillator directly to the determined internal signal in a one-step adjustment without iteration in order to obtain the intermediate frequency signal required.

7. The method as set forth in claim 6, further comprising the step of measuring a signal strength of the intermediate frequency signal, and, if the signal strength is below a predetermined level, not passing the intermediate frequency signal to the analog-to-digital converter.

8. The method as set forth in claim 6, further comprising the step of tuning the local oscillator is tuned to the internal signal within 5 microseconds.

9. The method as set forth in claim 6, wherein the input signal is sent from a wireless intra-oral sensor.

10. A receiver, comprising:
a radio frequency amplifier, adapted to amplify an input signal;
a local oscillator adapted to generate an internal signal;
a mixing circuit adapted to mix the input signal with the internal signal to generate an intermediate frequency signal;
an intermediate frequency filter adapted to filter the intermediate frequency signal;
an intermediate frequency amplifier adapted to amplify the filtered intermediate frequency signal;
a frequency detector adapted to translate the amplified intermediate frequency signal directly to a voltage;
an integration circuit adapted to process the voltage output by the frequency detector;
an analog-to-digital converter adapted to convert the voltage output by the integration circuit to a digital signal; and
a microcontroller adapted to determine the internal signal required based on the digital signal, and to send a control signal to the local oscillator to tune the local oscillator directly to the determined internal signal in a one-step adjustment without iteration in order to obtain the intermediate frequency signal required.

11. The receiver as set forth in claim 10, further comprising a signal strength indicator adapted to measure a signal strength of the intermediate frequency signal.

12. The receiver as set forth in claim 10, wherein the intermediate frequency signal strength indicator prevents the passing of the intermediate frequency signal to the analog-to-digital converter if the measured signal strength is below a predetermined level.

13. The receiver as set forth in claim 10, wherein the local oscillator is tuned to the internal signal within 5 microseconds.

14. The receiver as set forth in claim 10, wherein the input signal is sent from a wireless intra-oral sensor.

15. A receiver, comprising:
means for mixing an input signal with an internal signal in order to produce an intermediate frequency signal;
means for generating the internal signal;
means for translating the intermediate frequency signal directly to a voltage;
means for converting the voltage to a digital signal; and
means for determining the internal signal required based on the digital signal and sending a control signal to the means for generating the internal signal for tuning directly to the determined internal signal in a one-step adjustment without iteration in order to obtain the intermediate frequency signal required.

16. The receiver as set forth in claim 15, further comprising means for measuring a signal strength of the intermediate frequency signal.

17. The receiver as set forth in claim 16, wherein the measuring means prevents the passing of the intermediate frequency signal to the converting means if the measured signal strength is below a predetermined level.

18. The receiver as set forth in claim 15, wherein the means for generating the internal signal is tuned to the internal signal within 5 microseconds.

19. The receiver as set forth in claim 15, wherein the input signal is sent from a wireless intra-oral sensor.

20. A receiver, comprising:
a local oscillator adapted to generate an internal signal;
a mixing circuit adapted to mix an input signal with the internal signal in order to produce an intermediate frequency signal;
a frequency detector adapted to translate the intermediate frequency signal directly to a voltage;
an analog-to-digital converter adapted to convert the voltage to a digital signal; and
a microcontroller adapted to determine the internal signal required based on a comparison of the digital signal with a required intermediate frequency signal, and to send a control signal to the local oscillator which tunes the local oscillator directly to the determined internal signal in a one-step adjustment without iteration in order to obtain the required intermediate frequency signal.

21. The receiver as set forth in claim 20, further comprising a signal strength indicator adapted to measure a signal strength of the intermediate frequency signal.

22. The receiver as set forth in claim 21, wherein the intermediate frequency signal strength indicator prevents the passing of the intermediate frequency signal to the analog-to-digital converter if the measured signal strength is below a predetermined level.

23. The receiver as set forth in claim 20, wherein the local oscillator is tuned to the internal signal within 5 microseconds.

24. The receiver as set forth in claim 20, wherein the input signal is sent from a wireless intra-oral sensor.

* * * * *